(12) United States Patent  (10) Patent No.: US 8,367,524 B2
Lee  (45) Date of Patent: Feb. 5, 2013

(54) THREE-DIMENSIONAL INTEGRATED CIRCUIT STRUCTURE

(76) Inventor: Sang-Yun Lee, Beaverton, OR (US)

( * ) Notice: Subject to any disclaimer, the term of this patent is extended or adjusted under 35 U.S.C. 154(b) by 0 days.

(21) Appl. No.: 12/881,961

(22) Filed: Sep. 14, 2010

(65) Prior Publication Data

US 2011/0003438 A1  Jan. 6, 2011

Related U.S. Application Data

(63) Continuation-in-part of application No. 11/092,500, filed on Mar. 29, 2005, now Pat. No. 8,018,058, and a continuation-in-part of application No. 11/092,501, filed on Mar. 29, 2005, and a continuation-in-part of application No. 11/180,286, filed on Jul. 12, 2005, (Continued)

(51) Int. Cl.
*H01L 21/00* (2006.01)
*H01L 21/331* (2006.01)

(52) U.S. Cl. .................. 438/464; 438/618; 257/E21.57

(58) Field of Classification Search .................. 438/464, 438/618; 257/E21.57
See application file for complete search history.

(56) References Cited

U.S. PATENT DOCUMENTS

| | | |
|---|---|---|
| 4,704,785 A | 11/1987 | Curran |
| 4,732,312 A | 3/1988 | Kennedy et al. |
| 4,829,018 A | 5/1989 | Wahlstrom |
| 4,854,986 A | 8/1989 | Raby |
| 4,939,568 A | 7/1990 | Kato et al. |
| 5,047,979 A | 9/1991 | Leung |
| 5,087,585 A | 2/1992 | Hayashi |
| 5,093,704 A | 3/1992 | Saito et al. |
| 5,106,775 A | 4/1992 | Kaga et al. |
| 5,152,857 A | 10/1992 | Ito et al. |
| 5,250,460 A | 10/1993 | Yamagata et al. |
| 5,265,047 A | 11/1993 | Leung et al. |
| 5,266,511 A | 11/1993 | Takao |
| 5,277,748 A | 1/1994 | Sakaguchi et al. |
| 5,308,782 A | 5/1994 | Mazure et al. |
| 5,324,980 A | 6/1994 | Kusunoki |
| 5,355,022 A | 10/1994 | Sugahara et al. |
| 5,371,037 A | 12/1994 | Yonehara |
| 5,374,564 A | 12/1994 | Bruel |
| 5,374,581 A | 12/1994 | Ichikawa et al. |
| 5,554,870 A | 9/1996 | Fitch et al. |
| 5,563,084 A | 10/1996 | Ramm et al. |
| 5,617,991 A | 4/1997 | Pramanick et al. |
| 5,627,106 A | 5/1997 | Hsu |
| 5,695,557 A | 12/1997 | Yamagata et al. |
| 5,737,748 A | 4/1998 | Shigeeda |
| 5,829,026 A | 10/1998 | Leung et al. |
| 5,835,396 A | 11/1998 | Zhang |
| 5,854,123 A | 12/1998 | Sato et al. |
| 5,882,987 A | 3/1999 | Srikrishnan |
| 5,892,225 A | 4/1999 | Okihara |
| 5,915,167 A | 6/1999 | Leedy |
| 5,937,312 A | 8/1999 | Iyer et al. |
| 5,977,579 A | 11/1999 | Noble |
| 5,980,633 A | 11/1999 | Yamagata et al. |
| 5,998,808 A | 12/1999 | Matsushita |
| 6,009,496 A | 12/1999 | Tsai |
| 6,057,212 A | 5/2000 | Chan et al. |
| 6,103,597 A | 8/2000 | Aspar et al. |

(Continued)

*Primary Examiner* — William D Coleman
(74) *Attorney, Agent, or Firm* — Greg L. Martinez

(57) ABSTRACT

A method of forming a semiconductor structure includes coupling a semiconductor structure to an interconnect region through a bonding region. The interconnect region includes a conductive line in communication with the bonding region. The bonding region includes a metal layer which covers the interconnect region. The semiconductor structure is processed to form a vertically oriented semiconductor device.

25 Claims, 7 Drawing Sheets

Related U.S. Application Data now abandoned, and a continuation-in-part of application No. 11/378,059, filed on Mar. 17, 2006, and a continuation-in-part of application No. 11/606,523, filed on Nov. 30, 2006, now Pat. No. 7,888,764, and a continuation-in-part of application No. 11/873,719, filed on Oct. 17, 2007, and a continuation-in-part of application No. 11/873,769, filed on Oct. 17, 2007, and a continuation-in-part of application No. 12/040,642, filed on Feb. 29, 2008, now Pat. No. 7,800,199, and a continuation-in-part of application No. 12/165,475, filed on Jun. 30, 2008, now Pat. No. 7,846,814, and a continuation-in-part of application No. 12/397,309, filed on Mar. 3, 2009, now Pat. No. 7,863,748, and a continuation-in-part of application No. 12/470,344, filed on May 21, 2009, now Pat. No. 8,058,142, and a continuation-in-part of application No. 12/475,294, filed on May 29, 2009, now Pat. No. 7,799,675, and a continuation-in-part of application No. 12/581,722, filed on Oct. 19, 2009, and a continuation-in-part of application No. 12/618,542, filed on Nov. 13, 2009, now Pat. No. 7,867,822, and a continuation-in-part of application No. 12/635,496, filed on Dec. 10, 2009, now abandoned, and a continuation-in-part of application No. 12/637,559, filed on Dec. 14, 2009, and a continuation-in-part of application No. 12/731,087, filed on Mar. 24, 2010, now abandoned, and a continuation-in-part of application No. 12/847,374, filed on Jul. 30, 2010, and a continuation-in-part of application No. 12/874,866, filed on Sep. 2, 2010, now Pat. No. 8,071,438.

(56) References Cited

U.S. PATENT DOCUMENTS

| | | | |
|---|---|---|---|
| 6,153,495 A | 11/2000 | Kub et al. | |
| 6,222,251 B1 | 4/2001 | Holloway | |
| 6,229,161 B1 | 5/2001 | Nemati et al. | |
| 6,242,324 B1 | 6/2001 | Kub et al. | |
| 6,259,623 B1 | 7/2001 | Takahashi | |
| 6,331,468 B1 | 12/2001 | Aronowitz et al. | |
| 6,380,046 B1 | 4/2002 | Yamazaki | |
| 6,380,099 B2 | 4/2002 | Sakaguchi et al. | |
| 6,392,296 B1 * | 5/2002 | Ahn et al. | 257/698 |
| 6,417,108 B1 | 7/2002 | Akino et al. | |
| 6,423,614 B1 | 7/2002 | Doyle | |
| 6,531,697 B1 | 3/2003 | Nakamura et al. | |
| 6,534,382 B1 | 3/2003 | Sakaguchi et al. | |
| 6,535,411 B2 | 3/2003 | Jolin et al. | |
| 6,555,901 B1 | 4/2003 | Yoshihara et al. | |
| 6,600,173 B2 | 7/2003 | Tiwari | |
| 6,621,168 B2 | 9/2003 | Sundahl et al. | |
| 6,630,713 B2 | 10/2003 | Geusic | |
| 6,635,552 B1 | 10/2003 | Gonzalez | |
| 6,638,834 B2 | 10/2003 | Gonzalez | |
| 6,653,209 B1 | 11/2003 | Yamagata | |
| 6,661,085 B2 | 12/2003 | Kellar et al. | |
| 6,677,204 B2 | 1/2004 | Cleeves et al. | |
| 6,742,067 B2 | 5/2004 | Hsien | |
| 6,751,113 B2 | 6/2004 | Bhakta et al. | |
| 6,762,076 B2 | 7/2004 | Kim et al. | |
| 6,774,010 B2 | 8/2004 | Chu et al. | |
| 6,787,920 B2 | 9/2004 | Amir | |
| 6,806,171 B1 | 10/2004 | Ulyashin et al. | |
| 6,809,009 B2 | 10/2004 | Aspar et al. | |
| 6,822,233 B2 | 11/2004 | Nakamura et al. | |
| 6,844,243 B1 | 1/2005 | Gonzalez | |
| 6,849,891 B1 | 2/2005 | Hsu et al. | |
| 6,854,067 B1 | 2/2005 | Kutz et al. | |
| 6,864,534 B2 | 3/2005 | Ipposhi et al. | |
| 6,943,067 B2 | 9/2005 | Greenlaw | |
| 6,943,407 B2 | 9/2005 | Ouyang et al. | |
| 6,995,430 B2 | 2/2006 | Langdo et al. | |
| 7,002,152 B2 | 2/2006 | Grunewald | |
| 7,052,941 B2 | 5/2006 | Lee | |
| 7,067,396 B2 | 6/2006 | Aspar et al. | |
| 7,078,739 B1 | 7/2006 | Nemati et al. | |
| 7,109,092 B2 | 9/2006 | Tong | |
| 7,148,119 B1 | 12/2006 | Sakaguchi et al. | |
| RE39,484 E | 2/2007 | Bruel | |
| 7,217,636 B1 | 5/2007 | Atanackovic | |
| 7,245,002 B2 | 7/2007 | Akino et al. | |
| 7,256,104 B2 | 8/2007 | Ito et al. | |
| 7,378,702 B2 | 5/2008 | Lee | |
| 7,470,142 B2 | 12/2008 | Lee | |
| 7,470,598 B2 | 12/2008 | Lee | |
| 7,632,738 B2 | 12/2009 | Lee | |
| 7,633,162 B2 | 12/2009 | Lee | |
| 7,671,371 B2 | 3/2010 | Lee | |
| 7,709,932 B2 | 5/2010 | Nemoto et al. | |
| 7,718,508 B2 | 5/2010 | Lee | |
| 7,799,675 B2 | 9/2010 | Lee | |
| 7,800,199 B2 | 9/2010 | Oh et al. | |
| 7,846,814 B2 | 12/2010 | Lee | |
| 7,867,822 B2 | 1/2011 | Lee | |
| 7,888,764 B2 | 2/2011 | Lee | |
| 2002/0024140 A1 | 2/2002 | Nakajima et al. | |
| 2002/0025604 A1 | 2/2002 | Tiwari | |
| 2002/0141233 A1 | 10/2002 | Hosotani et al. | |
| 2003/0067043 A1 | 4/2003 | Zhang | |
| 2003/0102079 A1 | 6/2003 | Kalvesten et al. | |
| 2003/0113963 A1 | 6/2003 | Wurzer | |
| 2003/0119279 A1 | 6/2003 | Enquist | |
| 2003/0139011 A1 | 7/2003 | Cleeves et al. | |
| 2003/0205480 A1 | 11/2003 | Sakaguchi et al. | |
| 2003/0224582 A1 | 12/2003 | Shimoda et al. | |
| 2004/0012016 A1 | 1/2004 | Underwood et al. | |
| 2004/0113207 A1 | 6/2004 | Hsu et al. | |
| 2004/0131233 A1 | 7/2004 | Comaniciu et al. | |
| 2004/0147077 A1 | 7/2004 | Watanabe et al. | |
| 2004/0155301 A1 | 8/2004 | Zhang | |
| 2004/0156233 A1 | 8/2004 | Bhattacharyya | |
| 2004/0160849 A1 | 8/2004 | Rinerson et al. | |
| 2004/0259312 A1 | 12/2004 | Schlosser et al. | |
| 2005/0280154 A1 | 12/2005 | Lee | |
| 2005/0280155 A1 | 12/2005 | Lee | |
| 2005/0280156 A1 | 12/2005 | Lee | |
| 2006/0121690 A1 | 6/2006 | Pogge et al. | |
| 2006/0275962 A1 | 12/2006 | Lee | |
| 2007/0072391 A1 | 3/2007 | Pocas et al. | |
| 2007/0145514 A1 | 6/2007 | Kocon | |
| 2007/0190746 A1 | 8/2007 | Ito et al. | |
| 2007/0262457 A1 | 11/2007 | Lin | |
| 2008/0017906 A1 | 1/2008 | Pelella et al. | |
| 2008/0032463 A1 | 2/2008 | Lee | |
| 2008/0048327 A1 | 2/2008 | Lee | |
| 2009/0267233 A1 | 10/2009 | Lee | |
| 2010/0038743 A1 | 2/2010 | Lee | |
| 2010/0133695 A1 | 6/2010 | Lee | |
| 2010/0190334 A1 | 7/2010 | Lee | |
| 2011/0001172 A1 | 1/2011 | Lee | |
| 2011/0003438 A1 | 1/2011 | Lee | |
| 2011/0053332 A1 | 3/2011 | Lee | |

* cited by examiner

THREE-DIMENSIONAL INTEGRATED CIRCUIT STRUCTURE

CROSS-REFERENCE TO RELATED APPLICATIONS

This application is a continuation-in-part of, and claims the benefit of, U.S. patent application Ser. Nos.:
Ser. No. 11/092,500, filed on Mar. 29, 2005;
Ser. No. 11/092,501, filed on Mar. 29, 2005;
Ser. No. 11/180,286, filed on Jul. 12, 2005;
Ser. No. 11/378,059, filed on Mar. 17, 2006;
Ser. No. 11/606,523, filed on Nov. 30, 2006;
Ser. No. 11/873,719, filed on Oct. 17, 2007;
Ser. No. 11/873,769, filed on Oct. 17, 2007;
Ser. No. 12/040,642, filed on Feb. 29, 2008;
Ser. No. 12/165,475, filed on Jun. 30, 2008;
Ser. No. 12/397,309, filed Mar. 3, 2009;
Ser. No. 12/470,344, filed on May 21, 2009;
Ser. No. 12/475,294, filed on May 29, 2009;
Ser. No. 12/581,722, filed on Oct. 19, 2009;
Ser. No. 12/618,542, filed on Nov. 13, 2009;
Ser. No. 12/635,496, filed on Dec. 10, 2009;
Ser. No. 12/637,559, filed on Dec. 14, 2009;
Ser. No. 12/731,087, filed on Mar. 24, 2010;
Ser. No. 12/847,374, filed on Jul. 30, 2010; and
Ser. No. 12/874,866, filed on Sep. 2, 2010,
by the same inventor, the contents of all of these applications are incorporated by reference as though fully set forth herein.

BACKGROUND OF THE INVENTION

1. Field of the Invention

The present invention relates generally to semiconductors and, more particularly, to forming circuitry using wafer bonding.

2. Description of the Related Art

Advances in semiconductor manufacturing technology have provided computer chips with integrated circuits that include many millions of active and passive electronic devices, along with the interconnects to provide the desired circuit connections. As is well-known, most integrated circuits include laterally oriented active and passive electronic devices carried on a single major surface of a substrate. Active devices typically include transistors and passive devices typically include resistors, capacitors, and inductors. However, these laterally oriented devices consume significant amounts of chip area. It should be noted that laterally oriented devices are often referred to as horizontally oriented devices or horizontal devices.

It is desirable to provide computer chips that can operate faster so they can process more data in a given amount of time. The speed of operation of a computer chip is typically measured in the number of instructions per second it can perform. Computer chips can be made to process more data in a given amount of time in several ways. In one way, the number of devices included is increased so it operates faster because more information is processed in a given period of time. For example, if one computer chip operates on 32-bit data, then another that operates on 64-bit data processes information twice as fast because it performs more instructions per second. However, the 64-bit computer chip will need more devices since there are more bits to process at a given time.

The number of devices can be increased by making the devices included therein smaller, but this requires advances in lithography and increasingly expensive manufacturing equipment. The number of devices can also be increased by keeping their size the same and increasing the area of the computer chip. However, the yield of the computer chips fabricated in a run decreases as their area increases, which increases the overall cost.

Computer chips can also be made faster by decreasing the time it takes to perform certain tasks, such as storing and retrieving information to and from memory. The time needed to store and retrieve information can be decreased by embedding the memory with the computer chip on the same surface as the other devices, as is done with cache memory. However, there are several problems with this.

One problem is that the masks used to fabricate the memory devices are not necessarily compatible with the masks used to fabricate the other electronic devices. Hence, it is more complex and expensive to fabricate a computer chip with memory embedded in this way. Another problem is that memory devices tend to be large and occupy a significant amount of area. Hence, if most of the area on the computer chip is occupied by memory devices, there is less area for the other devices. The total area of the computer chip can be increased, but as discussed above, this decreases the yield and increases the cost.

SUMMARY OF THE INVENTION

The present invention involves a semiconductor structure, and a method of forming the semiconductor structure. The invention will be best understood from the following description when read in conjunction with the accompanying drawings.

DETAILED DESCRIPTION OF THE INVENTION

A semiconductor structure is disclosed for use with an electronic circuit in a computer chip. The semiconductor structure is bonded to an interconnect region and processed to form one or more vertically oriented semiconductor devices which are positioned above the electronic circuit. One or more of the vertically oriented semiconductor devices are in communication with the electronic circuit through a corresponding conductive line of the interconnect region. A vertically oriented semiconductor device is in communication with the electronic circuit through the corresponding conductive line because a signal can flow between the vertically oriented semiconductor device and electronic circuit through the conductive line. The signal flows between the vertically oriented semiconductor device and electronic circuit through the conductive line so that the electronic circuit can control the operation of the vertically oriented semiconductor device.

It should be noted that vertically oriented semiconductor devices are often referred to as vertically oriented devices or vertical devices.

The vertical devices can replace corresponding horizontal devices positioned on the same surface as the electronic circuit, as is usually done with cache memory. Replacing a horizontal device with a corresponding vertical device is advantageous because this provides more area for the electronic circuit since the vertical device are positioned above the electronic circuit instead of on the same surface. In this way, the electronic circuit can include more electronic devices without increasing the chip area. Further, more vertical devices can be included because they generally occupy less area than horizontal devices. For example, a vertical memory device occupies less area than a corresponding horizontal memory device.

The vertical devices are positioned closer to the electronic circuit so signals flow between them in less time. This allows the computer chip to operate faster. Further, the electronic circuit can be fabricated with a different mask set than the vertical devices. This allows them to be formed separately so the masks are less complicated and less expensive to make. The vertical devices are fabricated from blanket semiconductor layers after the blanket semiconductor layers have been bonded to the interconnect region. If the vertical devices are formed before they are bonded, the vertical devices need to be aligned with the electronic circuit. Avoiding this alignment step is desirable because it is complicated and expensive. This is especially true as the vertical devices and the devices of the electronic circuit become smaller.

Figure 1A:
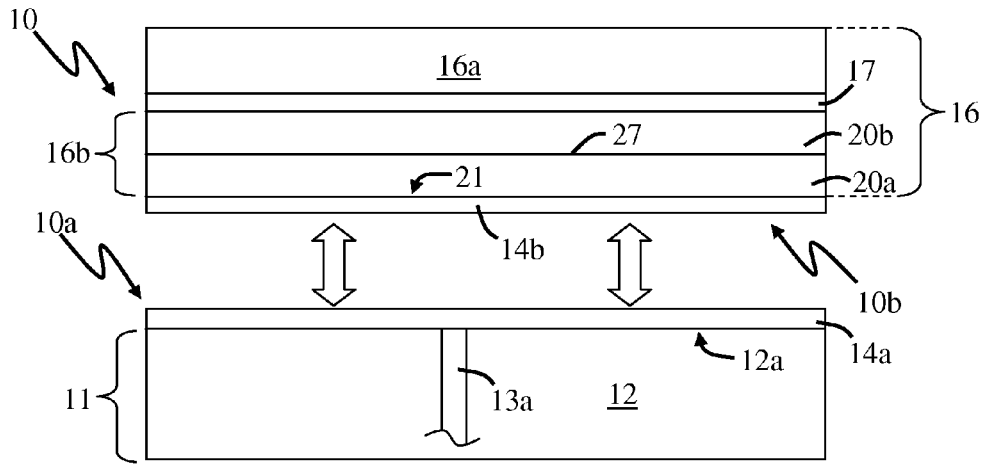
FIGS. 1a, 1b and 1c are side views showing steps in one embodiment of processing a semiconductor structure to form a mesa structure.
Figure 1B:
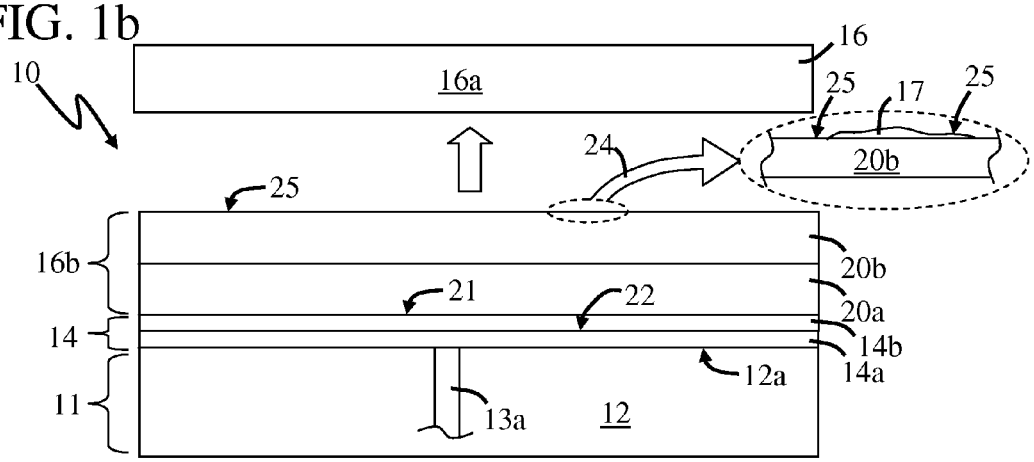
Figure 1C:
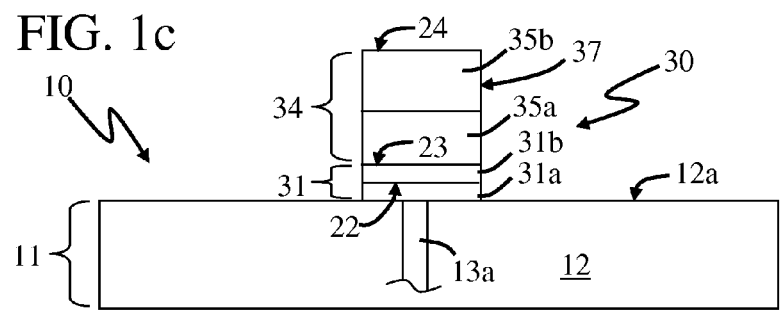

FIGS. 1a, 1b and 1c are side views showing steps in one embodiment of processing a semiconductor structure 10. It should be noted that in the following figures, like reference characters indicate corresponding elements throughout the several views. In this embodiment, structure 10 includes pieces 10a and 10b (FIG. 1a) which are processed to form a mesa structure 30 (FIG. 1c). It should be noted that pieces 10a and 10b, or portions thereof, can be provided prefabricated or fabricated as described below. Further, the formation of one mesa structure 30 is shown here for simplicity and ease of discussion, but a plurality of mesa structures are generally formed in an array of such structures.

In this embodiment, piece 10a includes an interconnect region 11 having a conductive line 13a extending through a dielectric region 12, and a conductive bonding layer 14a is carried on a surface 12a of interconnect region 11 so it is in communication with conductive line 13a. In this embodiment, conductive bonding layer 14a covers surface 12a of interconnect region 11. It should be noted that surface 12a is a major surface of interconnect region 11. Hence, in this embodiment, conductive bonding layer 14a covers a major surface of interconnect region 11. In this embodiment, surface 12a faces away from substrate 12.

It should be noted that, in general, interconnect region 11 includes one or more conductive lines, wherein the conductive line(s) are in communication with conductive bonding layer 14a. In some embodiments of FIG. 1a, all of the conductive lines of interconnect region 11 are in communication with conductive bonding layer 14a. In other embodiments of FIG. 1a, one or more of the conductive lines of interconnect region 11 are in communication with conductive bonding layer 14a. In some embodiments, the conductive lines of interconnect region 11 of FIG. 1a that will be in communication with a corresponding vertically oriented semiconductor device, as discussed below, are in communication with conductive bonding layer 14a.

In this embodiment, piece 10b includes a substrate 16 having a support structure 16a coupled to a multiple layer structure 16b through a detach region 17. Detach region 17 has a weaker mechanical strength relative to support structure 16a and multiple layer structure 16b. The mechanical strength of region 17 is sufficient enough at this step in the process to hold structures 16a and 16b together, but weak enough so they can be decoupled from each other during a subsequent step. Region 17 and structure 16b can be formed separately from substrate 16, but in this embodiment they are portions of it. More information regarding detach region is provided in the above-identified cross-referenced related patent applications.

Detach region 17 can include many different materials, such as oxide or porous semiconductor materials, and can be formed in many different ways. One way of forming a porous silicon detach region is disclosed in U.S. Pat. No. 6,380,099. In one embodiment, detach region 17 is a portion of substrate 16 that is formed by implanting a material therein using what is typically referred to as ion implantation. Here, the implanted material includes material implanted through a surface 21 of substrate 16. In this way, detach region 17 extends through substrate 16 and below surface 21. One way of forming detach region 17 by using implants is disclosed in U.S. Pat. No. 6,600,173.

Detach region 17 can be formed by implanting many different materials, such as ions from an inert gas like argon, neon, etc. The preferred gas, however, includes hydrogen so region 17 includes implanted hydrogen. The implanted material increases the amount of damage in detach region 17 and, consequently, reduces its mechanical strength relative to structures 16a and 16b. As will be discussed below, this is useful so a cleave can be formed through detach region 17 to provide a cleavage plane extending through substrate 16. The cleavage plane allows structures 16a and 16b to be decoupled from each other, as discussed in more detail with FIG. 1b.

Multiple layer structure 16b is a portion of piece 10a that includes multiple semiconductor layers. In this particular example, the multiple layers include a semiconductor layer 20b positioned adjacent to detach region 17 and a semiconductor layer 20a positioned adjacent to layer 20b. Semiconductor layers 20a and 20b can be formed in many different ways, such as with implantation and diffusion doping, although implantation is preferred. It should be noted that detach region 17 is generally formed before multiple layer structure 16b, but it can be formed afterwards in some examples by implanting through multiple layer structure 16b. More information regarding forming multiple layer structure 16b is provided in the above-identified cross-referenced related patent applications.

In this embodiment, multiple layer structure 16b includes two semiconductor layers which have different electrical properties. The electrical properties can be characterized in many different ways, such as conductivity type, doping concentration, composition, and/or band gap energy. Some layers of multiple layer structure 16b can also be nominally undoped which means they include impurities unintentionally incorporated with them during growth. Undoped semiconductor layers are often referred to as being intrinsically doped. In this particular example, semiconductor layers 20a and 20b are p-type and n-type, respectively, so they have opposite conductivity types. In this way, there is a pn junction formed by semiconductor layers 20a and 20b proximate to an interface 27, wherein interface 27 extends between semiconductor layers 20a and 20b.

Figure 3A:
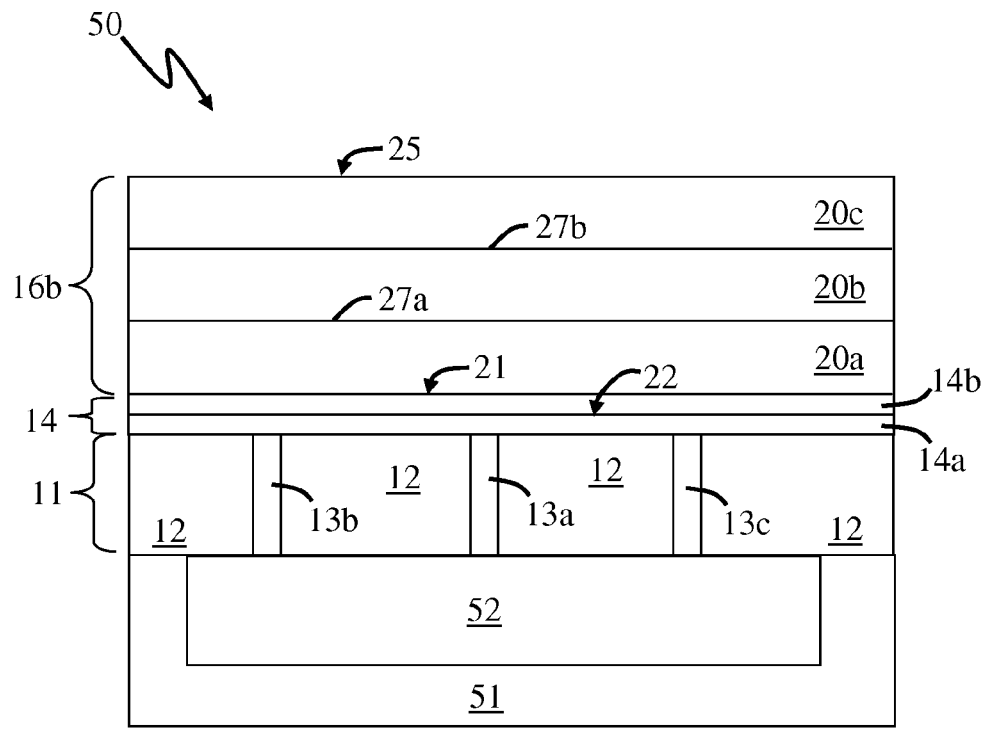
FIGS. 3a, 3b and 3c are side views showing steps in one embodiment of processing a semiconductor structure to fabricate a vertically oriented semiconductor device.
Figure 3B:
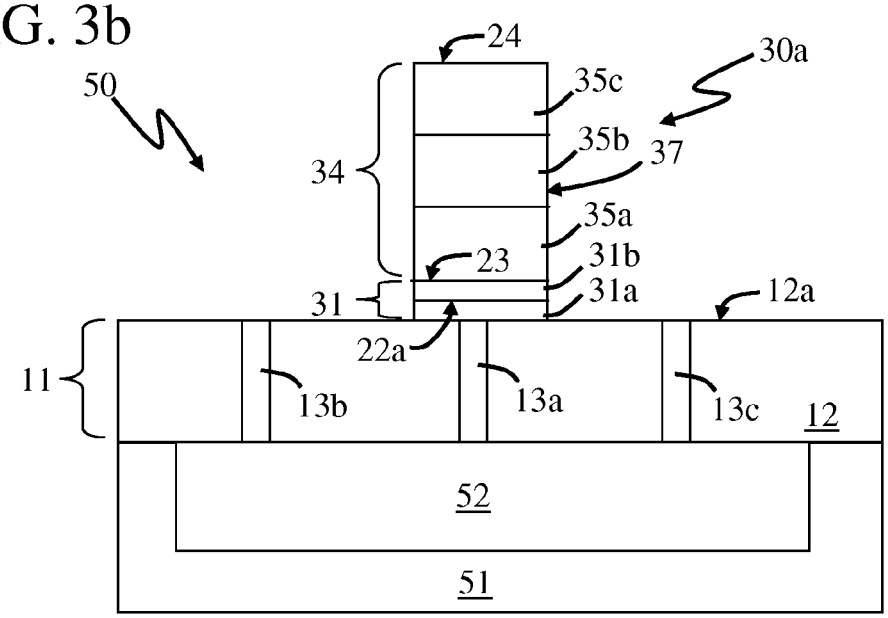

In some embodiments, multiple layer structure 16b includes more than two semiconductor layers. For example, multiple layer structure 16b can include pnp, npn, npnp, pnpn, nn+pp+, nn+p, and p−pn layer structures, among others. The layer structure will depend on the vertical device it is desired to form with multiple layer structure 16b. For example, a diode, transistor and thyristor generally include a layer structure with two, three and four semiconductor layers, respectively. An example of a three semiconductor layer stack for forming a transistor is shown in FIGS. 3a and 3b.

In some embodiments, vertical devices can be stacked on top of each other. For example, a semiconductor layer structure can include three semiconductor layers for a transistor and four semiconductor layers for a thyristor so the layer structure includes seven layers. In some of these examples, a layer between the stacked vertical devices can be shared. For example, the transistor and thyristor can share a semiconductor layer so the layer structure includes six layers instead of seven.

In general, however, multiple layer structure 16b includes two or more semiconductor layers having different electrical properties so there is an interface between the semiconductor layers. In this example, interface 27 is between semiconductor layers 20a and 20b and the current flow through interface 27 is substantially perpendicular to surface 21 when multiple layer structure 16b is used to form an electronic device. It should be noted that interface 27 is generally curved since it is formed by ion implantation and/or diffusion doping. However, here it is shown as being straight and extending parallel to surface 21 for simplicity and illustrative purposes.

In this embodiment, a conductive bonding layer 14b is positioned on surface 21. In some embodiments, surface 21 is planarized before conductive bonding layer 14b is positioned on it. The planarization can be done in many different ways, such as by chemical mechanical polishing and wet etching. It should be noted that chemical mechanical polishing generally involves grinding through a material region and is sometimes referred to as lapping.

Pieces 10a and 10b can include many different types of materials. Dielectric region 12 includes an insulative material, which is preferably silicon oxide. This is because silicon oxide is compatible with silicon processing technology. In other examples, region 12 can include other insulative materials, such as aluminum nitride and silicon nitride. Substrate 16 preferably includes silicon for several reasons. For example, silicon is inexpensive, readily available and compatible with silicon oxide. Further, the device subsequently formed with layer structure 16b is silicon based, as will be discussed below. Silicon is also preferable because it is currently used for most electronic circuits, such as digital and analog circuitry. Another material that substrate 16 can include is gallium arsenide, which is preferred for high speed devices, such as high frequency amplifiers. Indium phosphide, gallium nitride and silicon carbide are generally preferred for high power devices, such as transistors. Silicon germanium has a lower band gap energy than silicon, but it can be used for some of the same devices, such as transistors.

In this embodiment, multiple layer structure 16b includes crystalline semiconductor material, but it can also include amorphous and/or polycrystalline material in addition to crystalline material. The crystalline semiconductor material is preferably single crystal semiconductor material because it has fewer defects and, consequently, devices made with it operate better. For example, the leakage current of the device is less because single crystal semiconductor material has fewer defects.

Conductive line 13a and conductive bonding layers 14a and 14b can include many different conductive materials. In some embodiments, conductive line 13a and conductive bonding layers 14a and 14b include aluminum because aluminum has a low melting temperature so conductive line 13a and conductive bonding layers 14a and 14b can be formed at a low temperature. This is desirable because it reduces the degradation of the electrical properties of semiconductor structure 10, as discussed in more detail below. In other examples, conductive line 13a and conductive bonding layers 14a and 14b include other conductive materials, such as silver, gold, copper, and platinum. Other suitable conductive materials include refractory metals such as tantalum, molybdenum, and tungsten. The conductive material can also include polycrystalline semiconductor materials.

It should be noted that the insulative material of dielectric region 12 has a larger permittivity than the conductive material of conductive line 13a and conductive bonding layers 14a and 14b. Further, the insulative material of dielectric region 12 has a larger permittivity than the semiconductor material of multiple layer structure 16b.

It should be noted that the conductive material of conductive line 13a and conductive bonding layers 14a and 14b is more conductive than the insulative material of dielectric region 12. Further, the conductive material of conductive line 13a and conductive bonding layers 14a and 14b is more conductive than the semiconductor material of multiple layer structure 16b.

In this embodiment, and as indicated by the movement arrows in FIG. 1a, conductive bonding layers 14a and 14b are bonded together to form a bonding interface 22 in a bonding region 14, as shown in FIG. 1b. Bonding region 14 includes conductive bonding layers 14a and 14b and bonding interface 22 is between them. Bonding interface 22 is a metal bonding interface when conductive bonding layers 14a and 14b include metal. As mentioned above, conductive bonding layer 14a covers surface 12a of interconnect region 11. In this way, bonding region 14 covers surface 12a of interconnect region 11, and semiconductor structure 10 includes a conductive bonding layer which covers a major surface of an interconnect region. Other embodiments of bonding regions are discussed with FIGS. 2a-2c below.

Bonding interface 22 can be formed in many different ways. In one way, conductive bonding layer 14a is brought into contact with conductive bonding layer 14b at a bonding temperature sufficient to provide a bond between them so bonding interface 22 is formed. In this way, surface 21 is bonded to interconnect region 11 through bonding interface 22 and pieces 10a and 10b are bonded together. In another way, conductive bonding layers 14a and 14b are brought into contact with each other and then provided with a bonding temperature sufficient to provide a bond between them so bonding interface 22 is formed. Hence, multiple layer structure 16b is coupled to interconnect region 11 by establishing a bonding interface 22. It should be noted that bonding interface 22 is not a growth interface. More information regarding bonding interfaces can be found in the above-identified cross-referenced related patent applications. In particular, U.S. patent application Ser. Nos. 12/637,559, 12/731,087 and 12/581,722 discuss bonding and growth interfaces.

It should be noted that the strength of the bond between conductive bonding layers 14a and 14b depends substantially on the material included in them and the bonding temperature. The bonding temperature is chosen to provide a strong enough bond to hold pieces 10a and 10b together and is preferably in a range from about 250° C. to about 700° C. The bonding temperature is also chosen to reduce the degradation of other regions of semiconductor structure 10, such as multiple layer structure 16b and conductive line 13a. It is known that the properties of materials generally degrade as their temperature increases. For example, in conventional CMOS processes at BEOL (Back-End OF the Line), it is useful to bond at a temperature below about 500° C. to reduce the amount of degradation of the materials included therein.

It should also be noted that semiconductor layers 20a and 20b are typically formed before conductive bonding layer 14b is deposited on surface 21. For example, if layers 20a and 20b are formed by diffusion doping, then this is generally done before layer 14b is deposited on surface 21. However, if layers 20a and/or 20b are formed by ion implantation, then this can be done before or after layer 14b is deposited on surface 21. If the implantation is done afterwards, then material from conductive bonding layer 14b can be moved into structure 16b. This can decrease the electrical resistance between layer 14b and structure 16b.

Figure 2A:
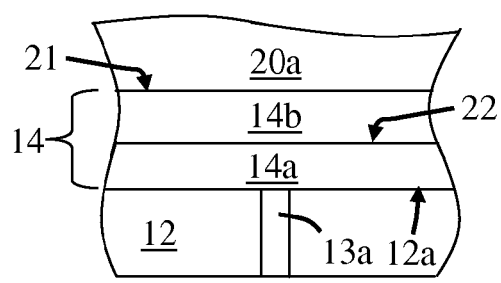
FIGS. 2a, 2b and 2c are partial side views showing different embodiments of bonding regions that can be included in the structures of FIGS. 1b and 1c.
Figure 2B:
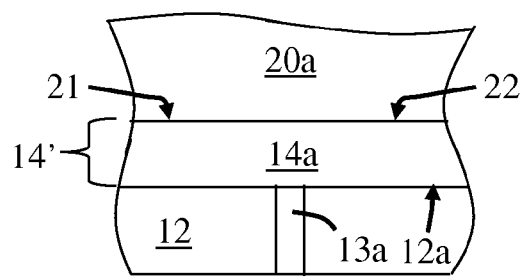
Figure 2C:
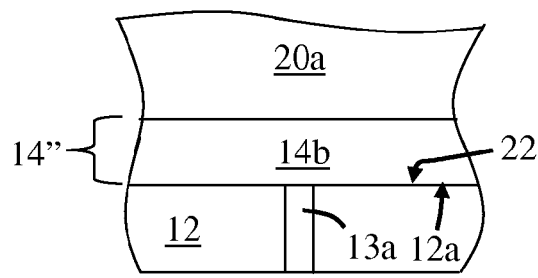

FIGS. 2a, 2b and 2c are partial side views showing different embodiments of bonding regions. FIG. 2a corresponds to bonding region 14 as shown in FIG. 1c where it includes metal layers 14a and 14b with bonding interface 22 between them. FIGS. 2b and 2c correspond to bonding regions 14' and 14", respectively. Bonding region 14' includes metal layer 14a so the bonding is between metal layer 14a and semiconductor layer 20a. Bonding interface 22 includes surface 21 so the bond is a metal-semiconductor bond. In one particular example, the semiconductor is silicon, so the bond is a metal-to-silicon bond. Bonding region 14" includes metal layer 14b so the bonding is between metal layer 14b and dielectric material 12. Bonding interface 22 includes surface 12a so the bond is a metal-insulator bond.

As shown in FIG. 1b, support structure 16a is decoupled from multilayer structure 16b so structure 16b is carried by interconnect region 11. Structure 16a can be decoupled from structure 16b in many different ways. In one embodiment, structures 16a and 16b are decoupled from each other by grinding through region 16a to detach region 17. The grinding can be done in many different ways, such as chemical mechanical polishing. In another embodiment, structures 16a and 16b are decoupled from each other by cleaving through detach region 17 to form a cleaved surface 25, which is opposed to surface 21. Cleaved surface 25 can be defined by structure 16b and/or portions of region 17 still attached to structure 16b after cleaving, as shown by substitution arrow 24. In some cleaving embodiments, surface 25 is planarized to form a planarized surface 24 (FIG. 1c) and to remove the portions of detach region 17 still attached to structure 16b. In some examples, the planarization can take place such that surface 24 extends into structure 16b. This ensures that all of detach region 17 is removed from multiple layer structure 16b.

It should be noted that the surface roughness of a planarized surface is less than the surface roughness of a non-planarized surface. An example of a non-planarized surface is a cleaved surface. The surface roughness can be determined in many different ways, such as by using a profilometer or an optical interferometer. The planarization can be done in many different ways, such as those discussed above with surface 21. If desired, structure 10, as shown in FIG. 1b, can be processed further. In one embodiment, multiple layer structure 16b is processed to form mesa structure 30, as will be discussed in more detail presently.

In this embodiment, structure 16b is selectively etched to surface 12a of interconnect region 11 to form mesa structure 30, as shown in FIG. 1c. Mesa structure 30 includes a conductive contact 31a positioned on surface 12a and a conductive contact 31b positioned on contact 31a. Conductive contacts 31a and 31b form a bonding contact region 31 having bonding interface 22 and correspond to portions of metal layers 14a and 14b, respectively, that have not been etched away. Bonding contact region 31 couples mesa structure 30 to interconnect region 11 through bonding interface 22 and is conductive so signals can flow through it. Mesa structure 30 also includes a semiconductor stack 34 with a semiconductor layer 35a positioned on contact 31b and a semiconductor layer 35b positioned on layer 35a. Stack 34, layer 35a, and layer 35b are portions of structure 16b, layer 20a, and layer 20b, respectively, that have not been etched away when processing structure 10 as shown in FIG. 1b.

The etching can be done in many different ways, such as with wet and dry etching. The etching is selective so conductive line 13a is in communication with mesa structure 30 through bonding region 30 and bonding interface 22. This can be done in many different ways, such as by using a mask aligned with conductive line 13a.

The etching is done so mesa structure 30 includes planarized surfaces 23 and 24 and has a sidewall 37 extending between them. In this example, sidewall 37 is straight and substantially perpendicular to bonding interface 22. However, in other examples, sidewall 37 can be curved and/or at an angle relative to bonding interface 22. It should be noted that, from a top view, mesa structure 30 can have many different shapes, such as rectangular, square and circular. If desired, mesa structure 30, or the array of mesa structures, can be processed further to form one or more vertically oriented semiconductor devices.

An electronic device formed with mesa structure 30 will operate as a diode since semiconductor stack 34 includes one pn junction. The diode is formed by forming another conductive line connected to surface 24 so a signal can be flowed through it, stack 34 and conductive line 13a. However, these details are left out of FIG. 1c for simplicity. In other examples, stack 34 includes more than two semiconductor layers. In these examples, a control terminal is typically positioned near sidewall 37 so it can adjust the conductivity of one or more of the layers included in stack 34 in response to a signal. The details of one such device will be discussed presently.

Figure 3C:
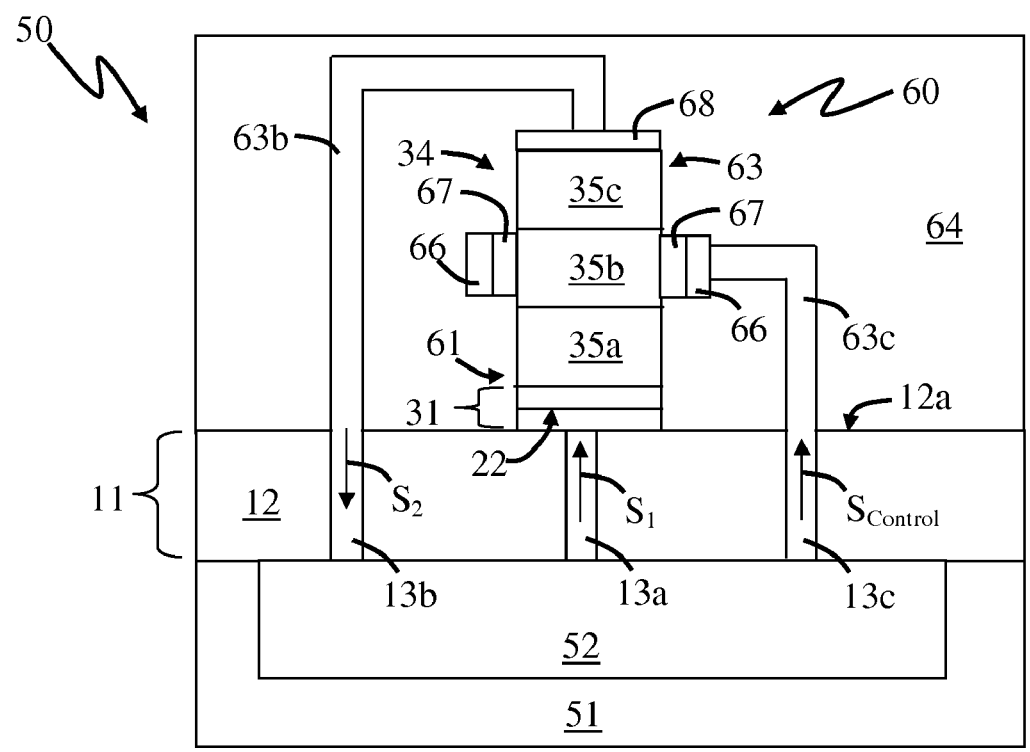

FIGS. 3a, 3b and 3c are side views showing steps in one embodiment of processing a semiconductor structure 50 to fabricate a vertically oriented semiconductor device 60 (FIG. 3c). It should be noted that some of the steps implemented in processing structure 50 to fabricate device 60 are the same or similar to those discussed above with FIGS. 1a-1c.

In this embodiment, structure 50 includes a substrate 51, which can include many different materials such as those discussed above with substrate 16. Substrate 51 carries an electronic circuit 52, which can be of many different types. Here, electronic circuit 52 includes silicon-based digital logic circuitry used to control the operation of vertically oriented semiconductor device 60, as will be discussed in more detail below.

In this embodiment, semiconductor structure 50 includes interconnect region 11, which is carried by substrate 51. Interconnect region 11 includes conductive line 13a, as well as conductive lines 13b and 13c. Conductive lines 13a, 13b and 13c are in communication with circuit 52 and extend through dielectric region 12.

In this embodiment, semiconductor structure 50 includes multiple layer structure 16b which is coupled to interconnect region 11 through bonding region 14, as discussed in more detail above. In this embodiment, bonding region 14 includes conductive bonding layers 14a and 14b and bonding interface 22 which extends between them.

In this embodiment, multiple layer structure 16b includes a semiconductor layer 20a positioned proximate to bonding region 14, a semiconductor layer 20b adjacent to semiconductor layer 20a and a semiconductor layer 20b adjacent to semiconductor layer 20b. In this way, multiple layer structure 16b includes three semiconductor layers. Semiconductor layer 20b extends between semiconductor layers 20a and 20c. Further, semiconductor layer 20c is spaced from semiconductor layer 20a by semiconductor layer 20b.

In this embodiment, multiple layer structure 16b includes an interface 27a which extends between semiconductor layers 20a and 20b, and an interfaces 127b which extends between semiconductor layers 20b and 20c. In some embodiments, interface 27a is proximate to a pn junction. Further, in some embodiments, interface 27b is proximate to a pn junction. In some embodiments, interfaces 27a and 27b are proximate to corresponding pn junctions.

As mentioned above, interconnect region 11 includes one or more conductive lines, wherein the conductive line(s) are in communication with bonding region 14. In some embodiments of FIG. 3a, all of the conductive lines of interconnect region 11 are in communication with bonding region 14. In other embodiments of FIG. 3a, one or more of the conductive lines of interconnect region 11 are in communication with bonding region 14. In some embodiments, the conductive lines of interconnect region 11 of FIG. 3a that will be in communication with a corresponding vertically oriented semiconductor device, as discussed below, are in communication with bonding region 14.

In particular, in some embodiments of FIG. 3a, all of the conductive lines of interconnect region 11 are in communication with conductive bonding layer 14a. In other embodiments of FIG. 3a, one or more of the conductive lines of interconnect region 11 are in communication with conductive bonding layer 14a. In some embodiments, the conductive lines of interconnect region 11 of FIG. 3a that will be in communication with a corresponding vertically oriented semiconductor device, as discussed below, are in communication with conductive bonding layer 14a.

In some embodiments of FIG. 3a, all of the conductive lines of interconnect region 11 are in communication with conductive bonding layer 14b through conductive bonding layer 14a. In other embodiments of FIG. 3a, one or more of the conductive lines of interconnect region 11 are in communication with conductive bonding layer 14b through conductive bonding layer 14a. In some embodiments, the conductive lines of interconnect region 11 of FIG. 3a that will be in communication with a corresponding vertically oriented semiconductor device, as discussed below, are in communication with conductive bonding layer 14b through conductive bonding layer 14a.

In some embodiments of FIG. 3a, all of the conductive lines of interconnect region 11 are in communication with conductive bonding layer 14b through conductive bonding layer 14a and bonding interface 22. In other embodiments of FIG. 3a, one or more of the conductive lines of interconnect region 11 are in communication with conductive bonding layer 14b through conductive bonding layer 14a and bonding interface 22. In some embodiments, the conductive lines of interconnect region 11 of FIG. 3a that will be in communication with a corresponding vertically oriented semiconductor device, as discussed below, are in communication with conductive bonding layer 14b through conductive bonding layer 14a and bonding interface 22.

In some embodiments of FIG. 3a, all of the conductive lines of interconnect region 11 are in communication with multiple layer structure 16b. In other embodiments of FIG. 3a, one or more of the conductive lines of interconnect region 11 are in communication with multiple layer structure 16b. In some embodiments, the conductive lines of interconnect region 11 of FIG. 3a that will be in communication with a corresponding vertically oriented semiconductor device, as discussed below, are in communication with multiple layer structure 16b.

In some embodiments of FIG. 3a, all of the conductive lines of interconnect region 11 are in communication with semiconductor layer 20a. In other embodiments of FIG. 3a, one or more of the conductive lines of interconnect region 11 are in communication with semiconductor layer 20a. In some embodiments, the conductive lines of interconnect region 11 of FIG. 3a that will be in communication with a corresponding vertically oriented semiconductor device, as discussed below, are in communication with semiconductor layer 20a.

In some embodiments of FIG. 3a, all of the conductive lines of interconnect region 11 are in communication with semiconductor layer 20a through bonding region 14. In other embodiments of FIG. 3a, one or more of the conductive lines of interconnect region 11 are in communication with semiconductor layer 20a through bonding region 14. In some embodiments, the conductive lines of interconnect region 11 of FIG. 3a that will be in communication with a corresponding vertically oriented semiconductor device, as discussed below, are in communication with semiconductor layer 20a through bonding region 14.

In some embodiments of FIG. 3a, all of the conductive lines of interconnect region 11 are in communication with semiconductor layer 20a through conductive bonding layer 14a and bonding interface 22. In other embodiments of FIG. 3a, one or more of the conductive lines of interconnect region 11 are in communication with semiconductor layer 20a through conductive bonding layer 14a and bonding interface 22. In some embodiments, the conductive lines of interconnect region 11 of FIG. 3a that will be in communication with a corresponding vertically oriented semiconductor device, as discussed below, are in communication with semiconductor layer 20a through conductive bonding layer 14a and bonding interface 22.

In some embodiments of FIG. 3a, all of the conductive lines of interconnect region 11 are in communication with semiconductor layer 20a through conductive bonding layers 14a and 14b and bonding interface 22. In other embodiments of FIG. 3a, one or more of the conductive lines of interconnect region 11 are in communication with semiconductor layer 20a through conductive bonding layers 14a and 14b and bonding interface 22. In some embodiments, the conductive lines of interconnect region 11 of FIG. 3a that will be in communication with a corresponding vertically oriented semiconductor device, as discussed below, are in communication with semiconductor layer 20a through conductive bonding layers 14a and 14b and bonding interface 22.

In FIG. 3b, a mesa structure 30a is formed in response to processing multiple layer structure 16b of FIG. 3a. In this embodiment, mesa structure 30a includes a stack 34 of semiconductor layers, wherein the semiconductor layers of stack 34 include portions of semiconductor layers 20a, 20b and 20c that are not etched away. The portions of semiconductor layers 20a, 20b and 20c that are not etched away are denoted as semiconductor layers 35a, 35b and 35c, respectively. It should be noted that stack 34 includes a sidewall 37 which extends around layers 35a, 35b and 35c.

Semiconductor layers 35a, 35b, and 35c can include many different types of semiconductor materials, such as those discussed above with FIGS. 1a-1c, but here they include silicon. In this example, layer 35a is doped n-type, layer 35b is doped p-type, and layer 35c is doped p-type so that a vertically oriented semiconductor device 60 (FIG. 3c) can be formed into a vertically oriented MOSFET, as will be discussed in more detail below.

Multiple layer structure 16b can be processed to form mesa structure 30a in many different ways. In this embodiment, multiple layer structure 16b is processed by selectively etching through semiconductor layers 20a, 20b and 20c, wherein the selective etching includes forming a patterned mask region (not shown) on surface 25. Multiple layer structure 16b is processed by selectively etching through surface 25 to form a surface 24, wherein surface 24 includes a portion of surface 25 that is not etched away. In this embodiment, surface 24 is bounded by sidewall 37, wherein sidewall 37 is an etched sidewall because it is formed by etching.

Surface 24 can have many different shapes. In this embodiment, surface 24 is circular so that mesa structure 30a is cylindrical in shape. More information regarding processing multiple layer structure 16b is provided in the above-identified cross-referenced related patent applications.

In FIG. 3b, a bonding contact region 31 is formed in response to processing bonding region 14 of FIG. 3a. Sidewall 37 extends between bonding contact region 31 and surface 24. Bonding region 14 can be processed to form bonding contact region 31 in many different ways. In this embodiment, bonding region 14 is processed by selectively etching through conductive bonding layers 14a and 14b to form conductive bonding contact layers 31a and 31b, respectively. More information regarding processing bonding region 14 is provided in the above-identified cross-referenced related patent applications.

It should be noted that bonding contact region 31 carries mesa structure 30a. In particular, bonding contact region 31 carries stack 34. Further, mesa structure 30a is spaced from interconnect region 11 by bonding contact region 31. In particular, stack 34 is spaced from interconnect region 11 by bonding contact region 31. Mesa structure 30a is spaced from conductive line 13a by bonding contact region 31. In particular, stack 34 is spaced from conductive line 13a by bonding contact region 31.

It should be noted that bonding contact region 31 includes a portion of bonding region 14 that is not etched away. In particular, bonding contact region 31 includes the portion of bonding region 14 between mesa structure 30a and conductive line 13a that is not etched away. Bonding contact region 31 includes portions of conductive bonding layers 14a and 14b that are not etched away. In particular, conductive bonding contact layers 31a and 31b include portions of conductive bonding layers 14a and 14b, respectively, that are not etched away.

It should also be noted that bonding interface 22 is etched in response to etching through bonding region 14 to form a bonding interface 22a. Bonding interface 22a extends between conductive bonding contact layers 31a and 31b. Bonding interface 22a includes a portion of interface 22 that is not etched away in response to forming bonding contact region 31.

In this embodiment, mesa structure 30a is coupled to interconnect region 11 through bonding contact region 31. In particular, stack 34 is coupled to interconnect region 11 through bonding contact region 31. In this embodiment, mesa structure 30a is coupled to interconnect region 11 through bonding contact region 31 and bonding interface 22a. In particular, stack 34 is coupled to interconnect region 11 through bonding contact region 31 and bonding interface 22a.

In this embodiment, conductive line 13a is in communication with mesa structure 30a through bonding contact region 31. In particular, conductive line 13a is in communication with stack 34 through conductive contact region 31. In this embodiment, conductive line 13a is in communication with mesa structure 30a through bonding contact region 31 and bonding interface 22a. In particular, conductive line 13a is in communication with stack 34 through conductive contact region 31 and bonding interface 22a.

In FIG. 3c, a vertically oriented semiconductor device 60 has an end 61 coupled to interconnect region 11 through bonding contact region 31 and an opposed end 63 away from bonding region 31. Bonding contact region 31 is in communication with electronic circuit 52 through conductive line 13a. In this way, end 61 is in communication with electronic circuit 52 and signals can flow between them. A conductive contact 68 is positioned on surface 24 and a conductive line 63b is formed which extends between contact 68 and conductive line 13b. In this way, end 63 is in communication with electronic circuit 52 and signals can flow between them.

In this embodiment, a dielectric region 67 is positioned around semiconductor stack 34 and a control terminal 66 is positioned around dielectric region 67. Control terminal 66 is in communication with conductive line 13c through a conductive line 63c. In this way, control terminal 66 is in communication with electronic circuit 52 and signals can flow between them.

In this embodiment, electronic circuit 52 flows one or more signals between it and vertically oriented semiconductor device 60 through interconnect region 11. The operation of device 60 can be controlled in many different ways in response to these signals. In one mode of operation, the conductivity of one or more layers in semiconductor stack 34 is adjusted in response to a control signal $S_{Control}$ flowed between circuit 52 and control terminal 66 through conductive lines 13c and 63c. An electric field between control terminal 66 and semiconductor stack 34 is provided through dielectric region 67 in response to $S_{Control}$. This electric field modulates the conductivity of semiconductor stack 34. The conductivity can be modulated so a depletion or inversion region extends through stack 34 substantially parallel to bonding interface 22. The depletion or inversion region also extends from the outer periphery of semiconductor stack 34 towards its center because dielectric region 67 and control terminal 66 surround stack 34 on sidewall 37.

In a second mode of operation, electronic circuit 52 provides a signal $S_1$ through conductive line 13a which flows through bonding contact region 31 and bonding interface 22. Signal $S_1$ flows through semiconductor stack 34 to end 63 where it is outputted as signal $S_2$. Signal $S_2$ flows through metal layer 68 to conductive line 63b and to circuit 52 to complete the circuit. In this way, the current flow through semiconductor stack 34 is substantially perpendicular to bonding interface 22.

It should be noted that signal $S_2$ corresponds to a scaled version of signal $S_1$. In this way, signal $S_2$ can be the same as signal $S_1$, or it can be an attenuated or amplified version of it. It should also be noted that the flow of signals $S_1$ and $S_2$ can be reversed in other examples.

In another mode of operation, device 60 operates as a MOSFET. In this mode, signal $S_1$ flows as described above and control signal $S_{Control}$ provides semiconductor stack 34 with a desired conductivity. The desired conductivity is chosen so that signal $S_1$ is scaled as it flows through semiconductor stack 34 and is outputted as signal $S_2$. In this way, signal $S_1$ is scaled after it flows through bonding interface 22. It should be noted that the flow of signals $S_1$ and $S_2$ can be reversed in some examples so that signal $S_1$ is scaled before it flows through bonding interface 22.

Figure 4A:
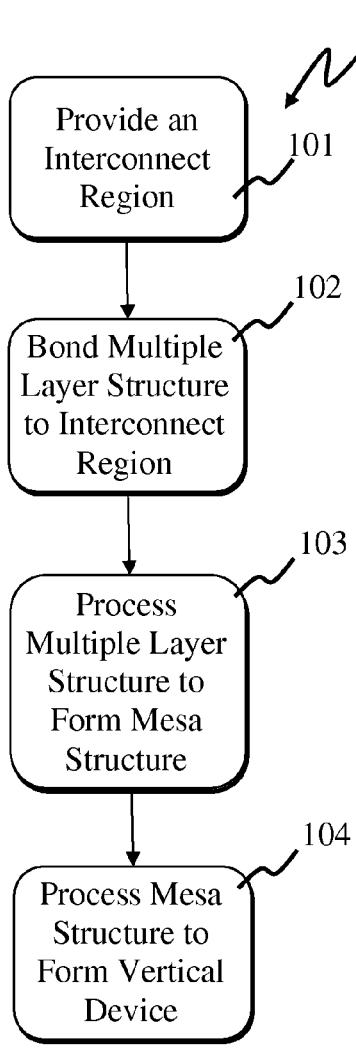
FIGS. 4a, 4b and 4c are flowcharts of methods of fabricating a semiconductor structure.

FIG. 4a is a flowchart of a method 100 of fabricating a semiconductor structure. In one embodiment, method 100 includes a step 101 of providing an interconnect region. In some embodiments, the interconnect region is carried by an electronic circuit. Method 100 also includes a step 102 of bonding a multiple layer structure to the interconnect region with a bonding region.

In this embodiment, step 102 includes forming a bonding interface. The bonding interface is generally formed between two conductive bonding layers included in the bonding region and positioned between the multiple layer structure and interconnect region. The two conductive bonding layers preferably include metals, so the bonding interface is a metal-to-metal bonding interface. The metals can be the same or different, with a preferred metal being aluminum. The conductive bonding layers are heated to a bonding temperature so they bond together.

In other embodiments, the bonding interface is at the interface of the bonding and interconnect regions, so the bond is a metal-insulator bond. A conductive bonding layer in the bonding region and the insulator in the interconnect region are heated to a bonding temperature so they bond together. In still other embodiments, the bonding interface is at the interface of the bonding region and multiple layer structure, so the bond is a metal-semiconductor bond. A conductive bonding layer in the bonding region and the semiconductor in the multiple layer structure are heated to a bonding temperature so they bond together.

In this embodiment, the multiple layer structure includes a stack of semiconductor material layers that can be processed to form a mesa structure. The multiple layer structure, or a portion thereof, preferably includes single crystal semiconductor material. At least two layers in the stack of semiconductor material layers have different electrical properties.

The interconnect region, electronic circuit, and/or multiple layer structure can be provided in many different ways. In one example, the interconnect region, electronic circuit, and/or multiple layer structure, or portions thereof, are prefabricated and provided to a user implementing method 100. In another example, the interconnect region, electronic circuit, and/or multiple layer structure, or portions thereof, are fabricated by the user implementing method 100. In some examples, the multiple layer structure and interconnect region are provided to the user already bonded together. In other examples, they are bonded together by the user.

In some embodiments, method 100 includes a step 103 of processing the multiple layer structure to form the mesa structure. This is generally done after the multiple layer structure is bonded to the interconnect region. The multiple layer structure can be processed in many different ways, such as by wet and dry etching. The dry etching can include chemical mechanical polishing. Step 103 typically includes using a mask to form the mesa structure in alignment with a conductive line extending through the interconnect region. Hence, an end of the multiple layer structure is in communication with the conductive line through the bonding region. In this way, the bonding region carries the mesa structure and bonds it to the interconnect region.

In some embodiments, method 100 can also include a step 104 of processing the mesa structure to form a vertically oriented semiconductor device. The vertically oriented semiconductor device is preferably in communication with the electronic circuit through the interconnect region so signals can flow between them. The mesa structure can be processed in many different ways to form the vertically oriented semiconductor device. The processing generally involves forming various conductive lines that extend between the vertically oriented semiconductor device and interconnect region.

In some examples, the processing involves forming a control terminal coupled to a sidewall of the mesa structure. The control terminal allows the conductivity of one or more of the semiconductor layers in the semiconductor stack to be adjusted in response to a control signal provided by the electronic circuit. The control terminal is typically spaced from the sidewall by a dielectric region. In this way, the vertically oriented semiconductor device can be formed to operate as many different electronic devices, such as a transistor, thyristor, etc.

Figure 4B:
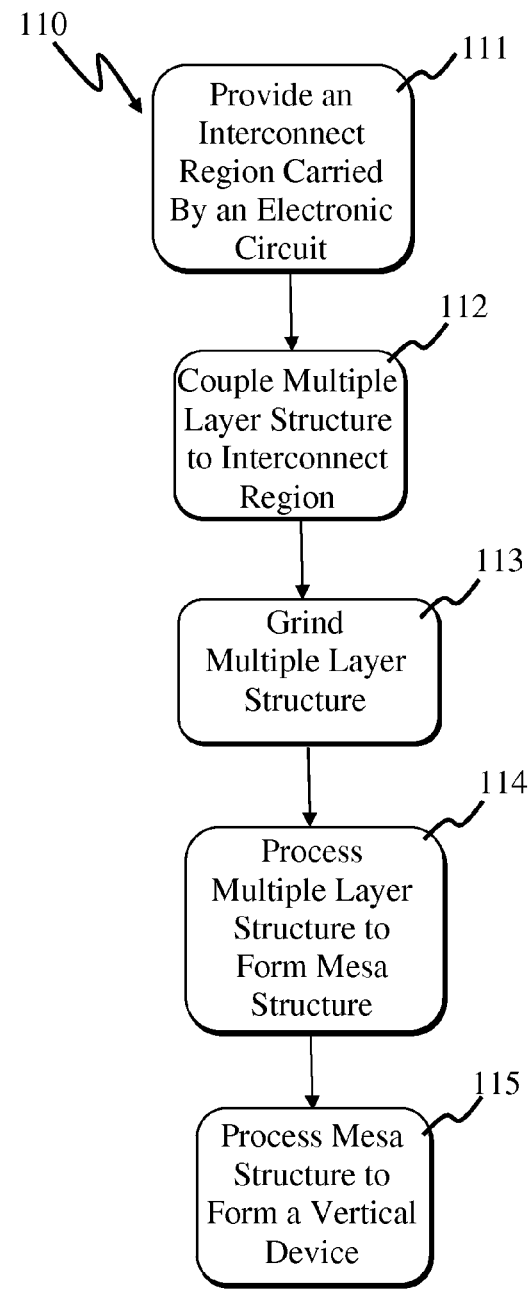

FIG. 4b is a flowchart of a method 110 of fabricating a semiconductor structure. It should be noted that method 110 can include the same or similar steps described above in conjunction with method 100. In one embodiment, method 110 includes a step 111 of providing an interconnect region carried by an electronic circuit and a step 112 of coupling a multiple layer structure to the interconnect region with a bonding region. The interconnect region is generally positioned between the electronic circuit and multiple layer structure. In this embodiment, the multiple layer structure is capable of being processed to form a mesa structure which has an end in communication with the electronic circuit through a conductive line extending through the interconnect region.

In some embodiments, method 110 includes a step 113 of grinding the multiple layer structure to reduce its thickness. The multiple layer structure can be ground in many different ways, such as with chemical mechanical polishing. Method 110 can also include a step 114 of processing the multiple layer structure to form the mesa structure. The multiple layer structure is processed so the bonding region couples the mesa structure to the interconnect region and an end of the mesa structure is in communication with the electronic circuit through the bonding region. Method 110 can also include a step 115 of processing the mesa structure to form a vertically oriented semiconductor device.

Figure 4C:
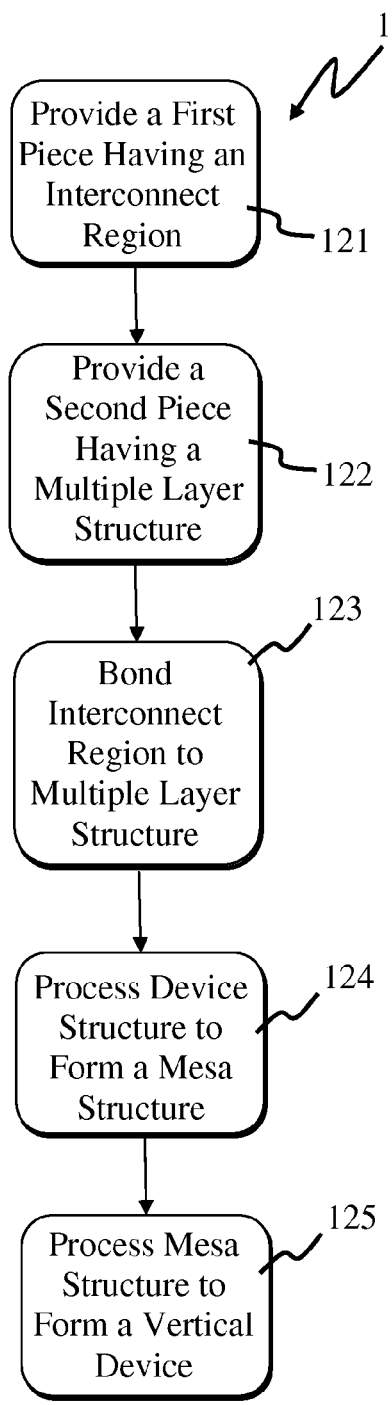

FIG. 4c is a flowchart of a method 120 of fabricating a semiconductor structure. It should be noted that method 120 can include the same or similar steps described above in conjunction with methods 100 and 110. In this embodiment, method 120 includes a step 121 of providing a first piece having a substrate that carries an electronic circuit and interconnect region. Method 120 also includes a step 122 of providing a second piece having a substrate which carries a multiple layer structure. Method 120 further includes a step 123 of bonding the interconnect region and the multiple layer structure together with a bonding region. The first and second pieces, or portions thereof, can be prefabricated or they can be fabricated by the user implementing method 120.

In some embodiments, method 120 includes a step 124 of processing the multiple layer structure to form a mesa structure. Step 124 typically includes aligning a mask with a conductive line extending through the interconnect region so the mesa structure is formed with an end in communication with the conductive line through the bonding region. In some embodiments, method 120 includes a step 125 of processing the mesa structure to form a vertically oriented semiconductor device. The vertically oriented semiconductor device is generally in communication with the electronic circuit through a conductive line extending through the interconnect region.

The interconnect region includes conductive lines which extend between the vertically oriented semiconductor device and the electronic circuit so an electrical signal can flow between them. In this way, the operation of the vertically oriented semiconductor device can be controlled using the electronic circuit. For example, if the vertically oriented semiconductor device is a memory device, the signal can read information stored by it. The signal can also write information to the memory device so the information is stored. Further, the signal can erase the information stored by the memory device.

Figure 5A:
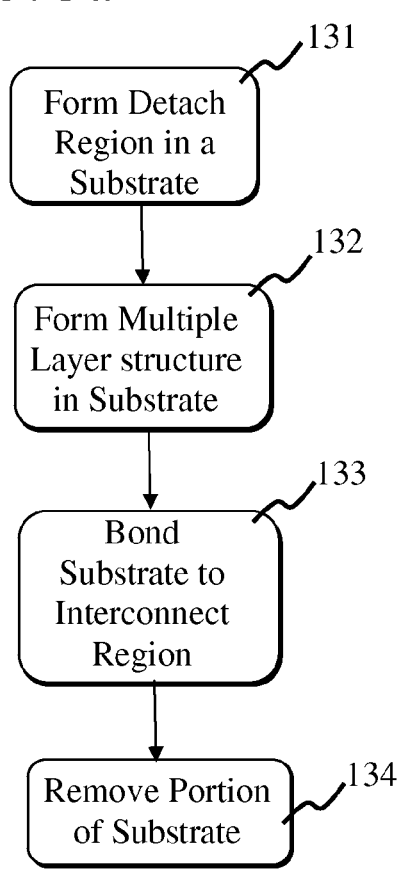
FIGS. 5a, 5b and 5c are flowcharts of methods of fabricating a semiconductor structure.

FIG. 5a is a flowchart of a method 130 of fabricating a semiconductor structure. It should be noted that method 130 can include the same or similar steps described above in conjunction with methods 100, 110, and 120. In this embodiment, method 130 includes a step 131 of forming a detach region below a surface of a substrate and a step 132 of forming a multiple layer structure which extends between the surface of the substrate and detach region. The detach region can be formed in many different ways, but is generally formed by implanting hydrogen into the substrate. In this embodiment, step 132 includes fabricating the multiple layer structure so it includes at least two layers having different electrical properties. In other examples, however, the multiple layer structure can be prefabricated.

In some embodiments, method 130 includes a step 133 of bonding the surface of the substrate to an interconnect region. The surface of the substrate is preferably bonded to the interconnect region with a bonding region, which is described above in more detail.

In some embodiments, method 130 includes a step 134 of removing at least a portion of the substrate between the detach region and an opposed surface of the substrate. The portion of the substrate can be removed in many different ways, such as by wet and dry etching. The portion of the substrate is preferably removed by cleaving through the detach region, but it can also be removed by grinding it. In this way, the portion of the substrate is removed and the multiple layer structure is carried by the interconnect region.

Figure 5B:
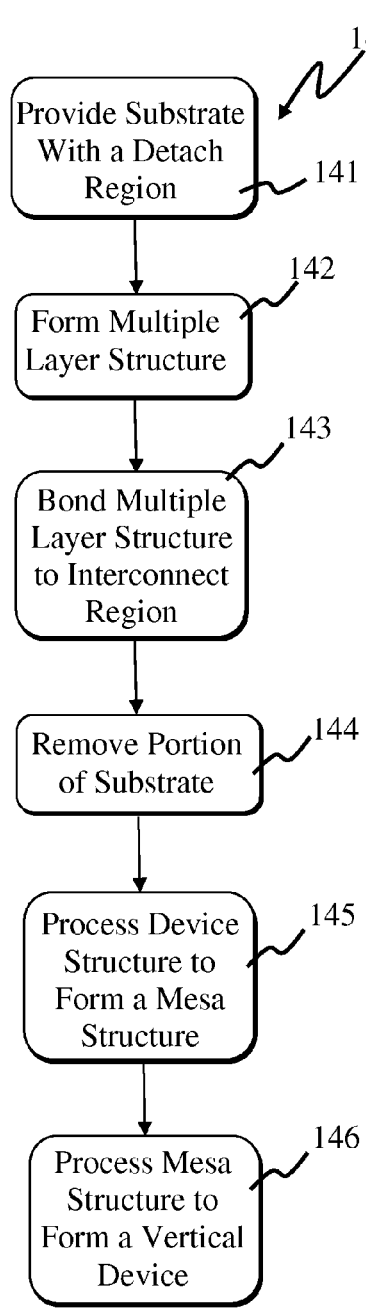

FIG. 5b is a flowchart of a method 140 of fabricating a semiconductor structure. It should be noted that method 140 can include the same or similar steps described above in conjunction with methods 100, 110, 120, and 130. In this embodiment, method 140 includes a step 141 of providing a substrate with a detach region extending below its surface. Method 140 also includes a step 142 of forming a multiple layer structure between the detach region and surface of the substrate. Method 140 further includes a step 143 of bonding the multiple layer structure to an interconnect region. The multiple layer structure is preferably bonded to the interconnect region with a bonding region, as described above.

In some embodiments, method 140 includes a step 144 of removing at least a portion of the substrate between its opposed surface and the detach region. The portion of the substrate can be removed as discussed above. In some embodiments, method 140 also includes a step 145 of processing the multiple layer structure to form a mesa structure. In these embodiments, method 140 can include a step 146 of processing the mesa structure to form a vertically oriented semiconductor device. The vertically oriented semiconductor device is usually in communication with an electronic circuit through the interconnect region.

Figure 5C:
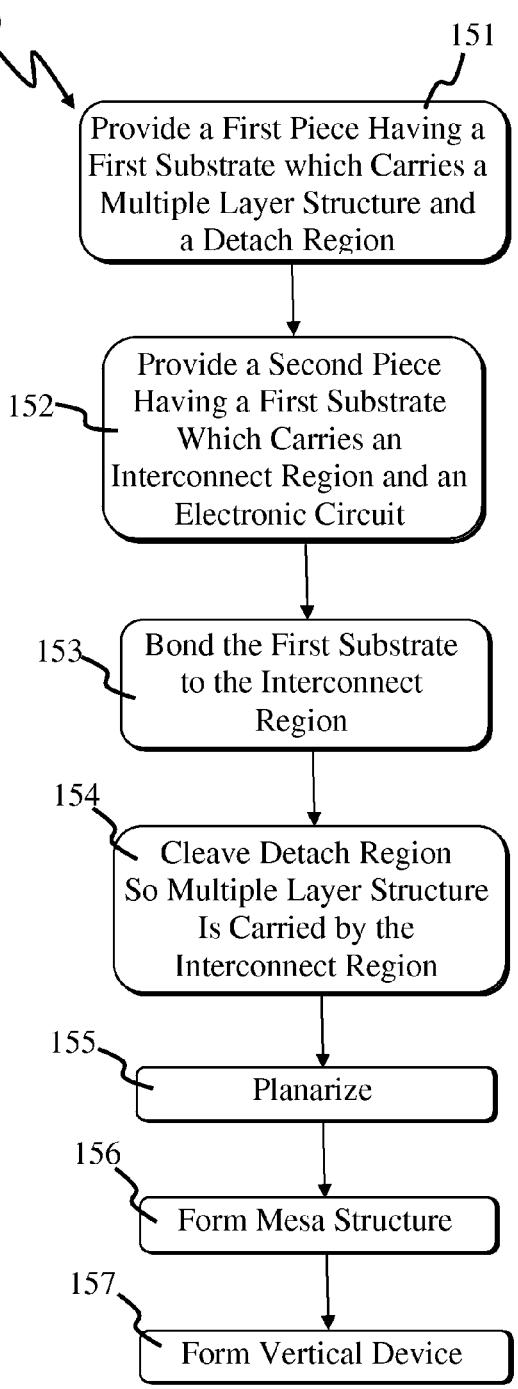

FIG. 5c is a flowchart of a method 150 of fabricating a semiconductor structure. It should be noted that method 150 can include the same or similar steps described above in conjunction with methods 100, 110, 120, 130, and 140. In this embodiment, method 150 includes a step 151 of providing a first piece having a first substrate with a multiple layer structure between its surface and a detach region extending below the surface of the substrate. The multiple layer structure preferably includes a stack of semiconductor material layers, with at least two of the layers having different electrical properties.

Method 150 also includes a step 152 of providing a second piece having a second substrate which carries an electronic circuit and interconnect region. It should be noted that the first and/or second pieces can be fabricated by the user implementing method 150 or prefabricated. Method 150 further includes a step 153 of bonding the first substrate to the interconnect region. The bonding is preferably provided by a bonding region positioned between the surface of the first substrate and the interconnect region.

In some embodiments, method 150 includes a step 154 of cleaving the detach region so the multiple layer structure is carried by the interconnect region. Method 150 can also include a step 155 of planarizing an exposed surface of the multiple layer structure after step 154. In some embodiments, method 150 includes a step 156 of forming a mesa structure from the multiple layer structure. In these embodiments, method 150 can include a step 157 of forming a vertically oriented semiconductor device from the mesa structure. The vertically oriented semiconductor device is preferably in communication with the electronic circuit through a conductive line extending through the interconnect region.

The embodiments of the invention described herein are exemplary and numerous modifications, variations and rearrangements can be readily envisioned to achieve substantially equivalent results, all of which are intended to be embraced within the spirit and scope of the invention as defined in the appended claims.

The invention claimed is:

1. A method, comprising:
    forming a conductive bonding region which is carried by an interconnect region; and
    coupling a multiple layer semiconductor structure to the interconnect region through the conductive bonding region, wherein the multiple layer semiconductor structure is carried by a support structure, and a porous silicon detach region extends between the support structure and multiple layer structure.

2. The method of claim 1, further including processing the multiple layer semiconductor structure to form a mesa structure bonded to the interconnect region through a contact region.

3. The method of claim 1, wherein the multiple layer semiconductor structure includes single crystalline semiconductor material.

4. The method of claim 1, further including forming the multiple layer semiconductor structure by depositing a blanket layer of semiconductor material on the detach region.

5. The method of claim 1, wherein the interconnect region includes a conductive line in communication with the conductive bonding region.

6. The method of claim 1, further including forming the bonding region by forming a metal layer on the interconnect region.

7. The method of claim 1, wherein the bonding region covers a major surface of the interconnect region.

8. The method of claim 2, further including processing the mesa structure to form a vertically oriented semiconductor device.

9. The method of claim 2, wherein the interconnect region includes a conductive line in communication with the contact region.

10. The method of claim 2, wherein the contact region is formed in response to removing a portion of the conductive bonding region.

11. A method, comprising:
providing an interconnect region carried by an electronic circuit;
forming a metal bonding region on the interconnect region;
providing a substrate which includes a support structure which carries a multiple layer semiconductor structure, wherein the substrate includes a detach region between the support structure and multiple layer structure and the detach region includes porous silicon; and
coupling the multiple layer structure to the interconnect region through the metal bonding region.

12. The method of claim 11, wherein the multiple layer structure is coupled to the interconnect region by establishing a bonding interface between the metal bonding region and semiconductor material of the multiple layer semiconductor structure.

13. The method of claim 11, wherein the multiple layer structure includes single crystal semiconductor material.

14. The method of claim 11, further including removing the support structure from the multiple layer structure so the multiple layer structure is carried by the interconnect region.

15. The method of claim 11, further including processing the multiple layer structure to form a mesa structure.

16. The method of claim 12, wherein the interconnect region includes a conductive line in communication with the metal bonding region.

17. A method, comprising:
coupling a multi layer semiconductor structure to an interconnect region through a bonding region which includes a metal, wherein the multiple layer semiconductor structure is coupled to a support structure by a porous silicon detach region;
wherein the interconnect region includes a conductive line in communication with the bonding region.

18. The method of claim 17, wherein the interconnect region includes a plurality of conductive lines in communication with the bonding region.

19. The method of claim 17, further including separating the multilayer semiconductor structure from the support substrate so the semiconductor structure is carried by the interconnect region.

20. The method of claim 17, wherein the multilayer semiconductor structure includes a planarized surface facing the bonding region.

21. The method of claim 17, further including forming the bonding region by forming a blanket metal layer on the interconnect region.

22. The method of claim 17, wherein the multilayer semiconductor structure includes single crystal semiconductor material.

23. The method of claim 17, wherein the multilayer semiconductor structure includes a pn junction.

24. The method of claim 17, wherein the bonding region covers a major surface of the interconnect region.

25. The method of claim 19, wherein the multilayer semiconductor structure includes a cleaved surface facing away from the bonding region.

* * * * *